US011257738B2

(12) United States Patent
Lilak et al.

(10) Patent No.: US 11,257,738 B2
(45) Date of Patent: Feb. 22, 2022

(54) VERTICALLY STACKED TRANSISTOR DEVICES WITH ISOLATION WALL STRUCTURES CONTAINING AN ELECTRICAL CONDUCTOR

(71) Applicant: Intel Corporation, Santa Clara, CA (US)

(72) Inventors: Aaron D. Lilak, Beaverton, OR (US); Anh Phan, Beaverton, OR (US); Patrick Morrow, Portland, OR (US); Stephanie A. Bojarski, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/646,129

(22) PCT Filed: Dec. 27, 2017

(86) PCT No.: PCT/US2017/068469
§ 371 (c)(1),
(2) Date: Mar. 10, 2020

(87) PCT Pub. No.: WO2019/132869
PCT Pub. Date: Jul. 4, 2019

(65) Prior Publication Data
US 2020/0273779 A1    Aug. 27, 2020

(51) Int. Cl.
*H01L 23/48*         (2006.01)
*H01L 21/8234*       (2006.01)
(Continued)

(52) U.S. Cl.
CPC .... *H01L 23/481* (2013.01); *H01L 21/823431* (2013.01); *H01L 21/823475* (2013.01); *H01L 27/0886* (2013.01)

(58) Field of Classification Search
CPC ............. H01L 27/1211; H01L 27/0688; H01L 21/8221; H01L 21/823431; H01L 25/0657
See application file for complete search history.

(56) References Cited

U.S. PATENT DOCUMENTS 7,842,994 B2    11/2010  Yin et al.
2008/0054359 A1*  3/2008  Yang ................... H01L 21/8221
                                                     257/351

(Continued)

OTHER PUBLICATIONS

International Search Report and Written Opinion for International Patent Application No. PCT/US2017/068469 dated Sep. 21, 2018, 13 pgs.

(Continued)

*Primary Examiner* — Christine A Enad
(74) *Attorney, Agent, or Firm* — Schwabe, Williamson & Wyatt, P.C.

(57) ABSTRACT

An integrated circuit structure comprises a lower device layer that includes a first structure comprising a first set of transistor fins and a first set of contact metallization. An upper device layer is bonded onto the lower device layer, where the upper device layer includes a second structure comprising a second set of transistor fins and a second set of contact metallization. At least one power isolation wall extends from a top of the upper device layer to the bottom of the lower device layer, wherein the power isolation wall is filled with a conductive material such that power is routed between transistor devices on the upper device layer and the lower device layer.

25 Claims, 11 Drawing Sheets

(51) Int. Cl.
  *H01L 27/088* (2006.01)
  *H01L 21/822* (2006.01)

(56) References Cited

U.S. PATENT DOCUMENTS

| | | | |
|---|---|---|---|
| 2013/0122672 A1* | 5/2013 | Or-Bach | H01L 21/845 438/199 |
| 2015/0061026 A1* | 3/2015 | Lin | H01L 21/823475 257/369 |
| 2016/0111369 A1* | 4/2016 | Or-Bach | H01L 29/66825 257/757 |
| 2016/0197069 A1 | 7/2016 | Morrow et al. | |
| 2016/0293756 A1* | 10/2016 | Liu | H01L 29/66666 |
| 2018/0076139 A1* | 3/2018 | Liu | H01L 23/53266 |

OTHER PUBLICATIONS

International Preliminary Report on Patentability for International Patent Application No. PCT/US2017/068469 dated Jul. 9, 2020, 7 pgs.

* cited by examiner

US 11,257,738 B2

VERTICALLY STACKED TRANSISTOR DEVICES WITH ISOLATION WALL STRUCTURES CONTAINING AN ELECTRICAL CONDUCTOR

CROSS-REFERENCE TO RELATED APPLICATION

This patent application is a U.S. National Phase Application under 35 U.S.C. § 371 of International Application No. PCT/US2017/068469, filed Dec. 27, 2017, entitled "VERTICALLY STACKED TRANSISTOR DEVICES WITH ISOLATION WALL STRUCTURES CONTAINING AN ELECTRICAL CONDUCTOR," which designates the United States of America, the entire disclosure of which is hereby incorporated by reference in its entirety and for all purposes.

TECHNICAL FIELD

Embodiments of the disclosure are in the field of integrated circuit structures and, in particular, vertically stacked transistor devices with isolation wall structures containing an electrical conductor.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
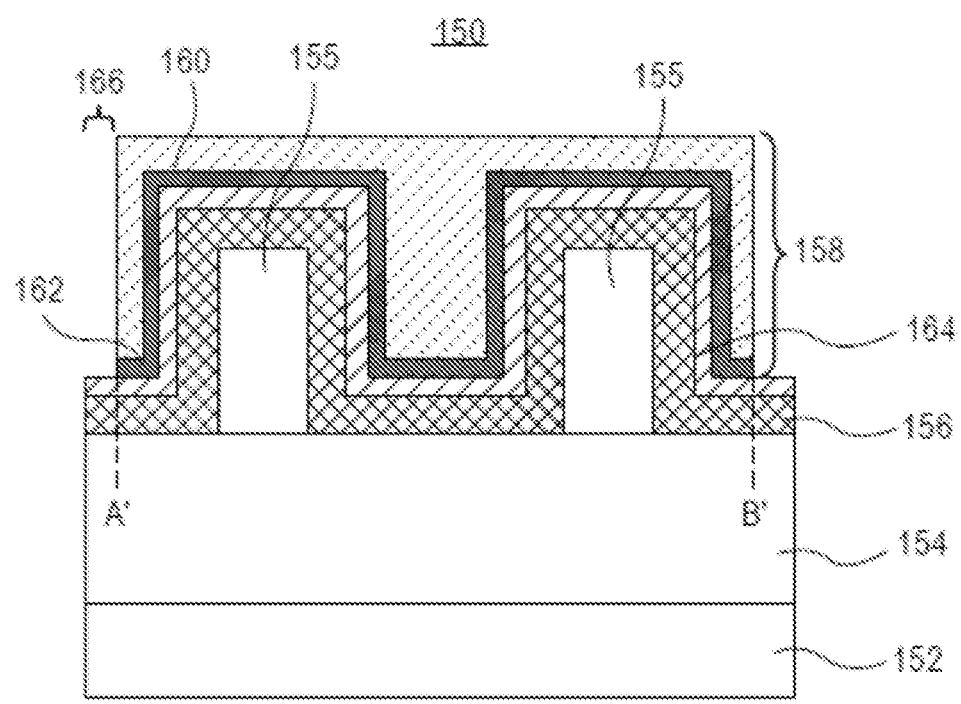
FIG. 1A illustrates a cross-sectional view taken along a gate "width" of a fin-type transistor suitable for use in a monolithic stacked transistor architecture, in accordance with an embodiment of the present disclosure.

Vertically stacked transistor devices with isolation wall structures containing an electrical conductor are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating vertically stacked transistor devices with isolation wall structures containing an electrical conductor. Embodiments may include or pertain to one or more of monolithic stacking, stacked transistors, and vertical integration. One or more embodiments may be implemented to realize high performance stacked transistors to potentially increase monolithic integration in SoCs of future technology nodes.

In accordance with one or more embodiments described herein, a monolithic stacked transistor architecture is disclosed in which an electrical connection is made between an upper device layer and a lower device layer. This electrical connection is formed via formation of a power isolation wall that is located between adjacent transistor devices and filled with a metal electrical conductor and extends from the upper device layer to the lower device layer. The present embodiments improve on known approaches for routing metal from the upper device layer to the lower device layers in that the use of an electrically conducting isolation wall does not increase cross-sectional footprint of the stacked structure.

To provide context, FIG. 1A illustrates a cross-sectional view taken along a gate "width" of a fin-type transistor suitable for use in a monolithic stacked transistor architecture, in accordance with an embodiment of the present disclosure.

In this example, the fin-type transistor comprises a non-planar thin-film transistor (TFT) 150 formed above a substrate 152, e.g., on an insulating layer 154 above a substrate. A pair of dielectric fins 155 is on the insulating layer 154. The non-planar TFT 150 includes a semiconducting oxide material 156, or similarly suitable channel material. The semiconducting oxide material 156 is conformal with the pair of dielectric fins 155 and with exposed portions of the insulating layer 154 between the pair of dielectric fins 155. A gate electrode 158 is formed on a gate dielectric layer 164 formed on the semiconducting oxide material 156. The gate electrode 158 may include a fill material 160 on a work-function layer 162, as is depicted. The gate electrode 158 may expose regions 166 of the semiconducting oxide material 156 and the gate dielectric layer 164, as is depicted. Alternatively, the semiconducting oxide material 156 and the gate dielectric layer 164 have a same lateral dimension as the gate electrode 158. It is to be appreciated that source/drain regions are into and out of the page of the view of FIG. 1B.

Figure 1B:
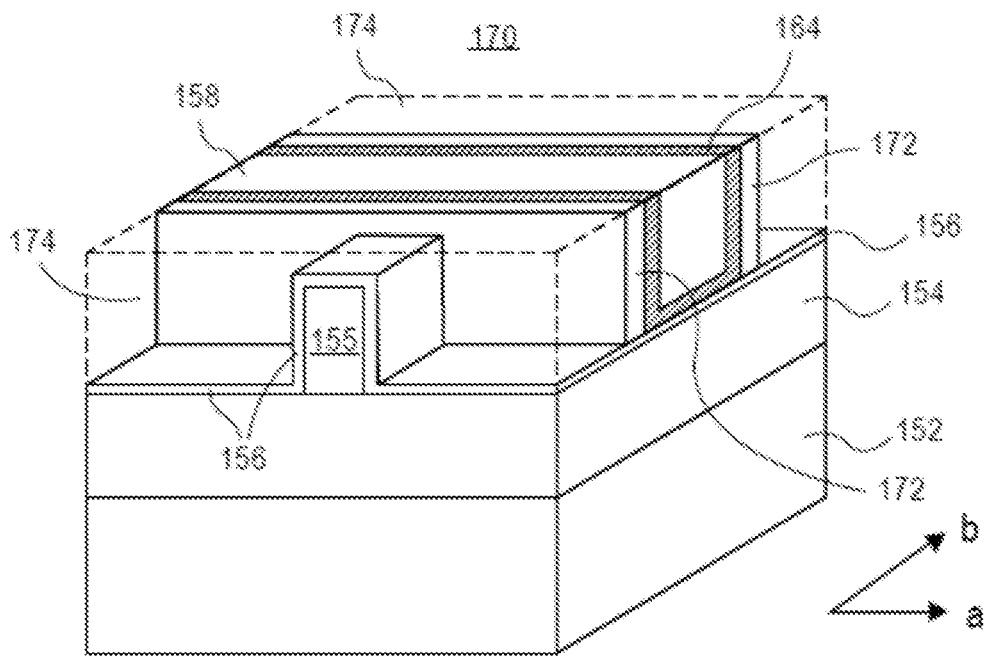
FIGS. 1B and 1C illustrate angled and direct cross-sectional views of a thin film integrated circuit structure, in accordance with an embodiment of the present disclosure.

The non-planar TFT 150 has an effective gate width that is the length of the conformal semiconducting oxide material 156 between locations A' and B', i.e., the full length including undulating portions over the tops and sidewalls of the dielectric fins 155, as is depicted in FIG. 1B. The TFT 150 may be referred to herein as a non-planar BEOL field effect transistor (FET). In comparison to a conventional planar TFT, the structure of FIG. 1A highlights the advantage of a non-planar architecture to increase effective gate width, referred to herein as a relatively increased width.

Figure 1C:
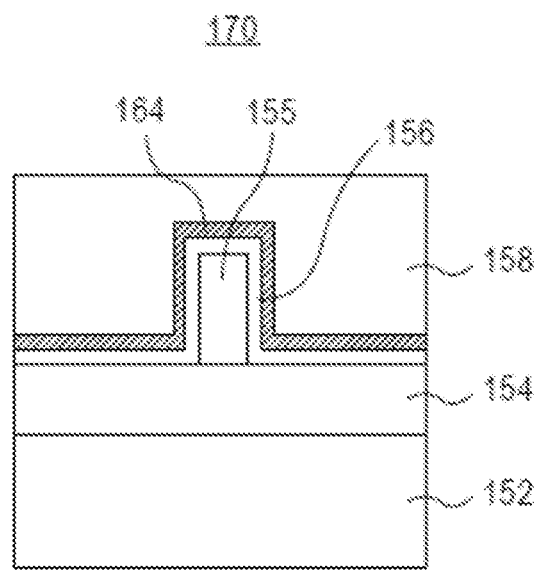

To highlight other aspects of a fin-type transistor topography, FIGS. 1B and 1C illustrate angled and direct cross-sectional views of a thin film integrated circuit structure, in accordance with an embodiment of the present disclosure. It is to be appreciated that one dielectric fin is illustrated in FIGS. 1B and 1C for simplification. Embodiments may include a single device fabricated over one (FIGS. 1B and 1C), two (FIG. 1A) or more such dielectric fins.

Referring to FIGS. 1B and 1C, an integrated circuit structure 170 includes a dielectric fin 155 on an insulator layer 154 above a substrate 152. The insulator structure 155 has a topography that varies along a plane (ab) parallel with a global plane of the substrate 152. The dielectric fin 155 has a top and sidewalls. A semiconducting oxide material 156, or similarly suitable channel material, is on the top and sidewalls of the dielectric fin 155. A gate electrode 158 is over a first portion of the semiconducting oxide material 156 on the top and sidewalls of the dielectric fin 155. The insulator structure 155 has a topography that varies along a plane (ab) parallel with a global plane of the substrate 152. The gate electrode 158 has a first side opposite a second side. A first conductive contact (left 174) is adjacent the first side of the gate electrode 158, over a second portion of the semiconducting oxide material 156 on the top and sidewalls of the dielectric fin 155. A second conductive contact (right 174) is adjacent the second side of the gate electrode 158, over a third portion of the semiconducting oxide material 156 on the top and sidewalls of the dielectric fin 155.

In an embodiment, the integrated circuit structure 170 further includes a gate dielectric layer 164 between the gate electrode 158 and the first portion of the semiconducting oxide material 156 on the top and sidewalls of the dielectric fin 155, as is depicted in FIG. 1C. In an embodiment, the integrated circuit structure 170 further includes a first dielectric spacer (left 172) between the first conductive contact 174 and the first side of the gate electrode 158, the first dielectric spacer 172 over a fourth portion of the semiconducting oxide material 156 on the top and sidewalls of the dielectric fin 155 as is depicted in FIG. 1B. A second dielectric spacer (right 172) is between the second conductive contact 174 and the second side of the gate electrode 158, the second dielectric spacer 172 over a fifth portion of the second semiconducting oxide material 156 on the top and sidewalls of the dielectric fin 155, as is depicted in FIG. 1C. In one such embodiment, the gate dielectric layer 164 is further along the first and second dielectric spacers 172, as is also depicted in FIG. 1C.

In an embodiment, the insulator structure 155 (such as fin or fins 155) is composed of a dielectric material such as, but not limited to, silicon dioxide, silicon oxy-nitride, silicon nitride, or carbon-doped silicon nitride. In an embodiment, the insulator structure 155 is composed of a low-k dielectric material. In an embodiment, the gate dielectric layer 164 includes a layer of a high-k dielectric material directly on the semiconducting oxide material 156.

Figure 1D:
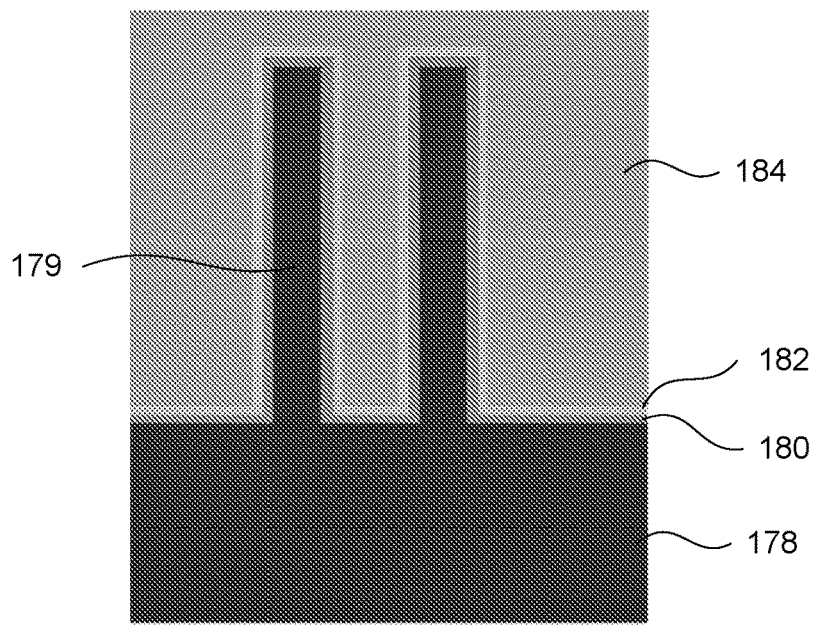
FIG. 1D illustrates a cross-sectional view taken along a gate "width" of a bulk FinFet transistor suitable for use in a monolithic stacked transistor architecture, in accordance with another embodiment of the present disclosure.

FIG. 1D illustrates a cross-sectional view taken along a gate "width" of a bulk Fin-type field effect transistors (FinFET) suitable for use in a monolithic stacked transistor architecture, in accordance with another embodiment of the present disclosure. In this example, the FinFET 176 is formed above a bulk semiconductor 178 such as silicon, silicon germanium, gallium arsenide, and the like. A pair of fins 179 is on the bulk semiconductor 178. The fins 179 of the FinFET 176 may be composed of the same material as the bulk semiconductor 178. The bulk FinFET 176 includes a gate dielectric 180 that is conformal to the pair of fins 179. The gate dielectric may possibly include a transition layer. In an embodiment, the gate dielectric 180 may comprise high-K (HfO2), while the transition layer may comprise a thin layer of SiO2. Other materials 182 are formed on the gate dielectric 180, such as work function metal(s), diffusion barrier(s) and the like. A conductor metal 184, such as tungsten, titanium nitride, copper, and the like, is formed over the other materials 182, as shown.

Figure 1E:
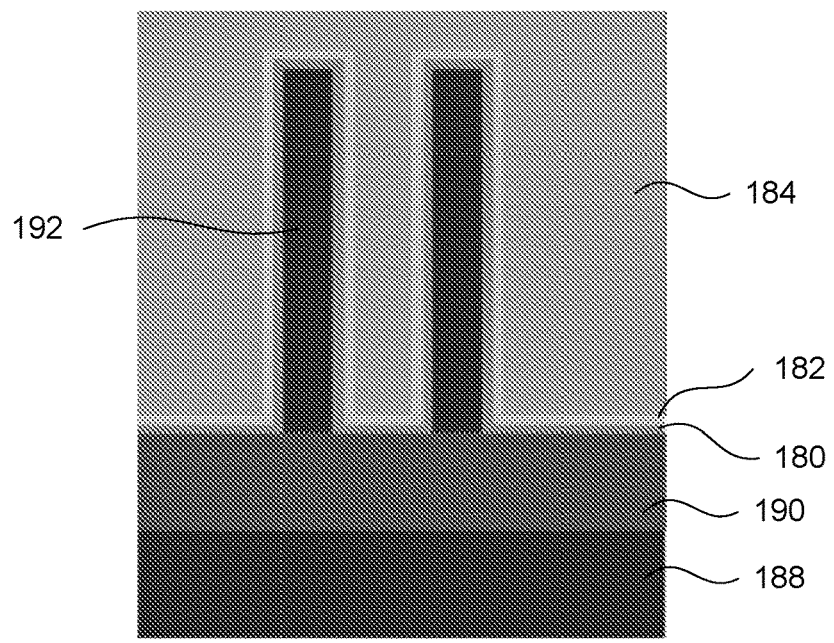
FIG. 1E illustrates a cross-sectional view taken along a gate "width" of a silicon-on-insulator (SOI) FinFet suitable for use in a monolithic stacked transistor architecture, in accordance with further embodiment of the present disclosure.

FIG. 1E illustrates a cross-sectional view taken along a gate "width" of a silicon-on-insulator (SOI) FinFET suitable for use in a monolithic stacked transistor architecture, in accordance with further embodiment of the present disclosure. In this example, the SOI FinFET 186 is formed above a bulk substrate 188. A SOI oxide or bonding layer 190 is formed over the bulk substrate 188. A pair of fins 192 is on the bulk substrate 188. The fins 192 of the SOI FinFET 186 may be composed of the same material as the bulk substrate 188. The SOI FinFET 186 includes a gate dielectric 180 that is conformal to the pair of fins 192. The gate dielectric 180 may possibly include a transition layer. Other materials 182 are formed on the gate dielectric 180, such as work function metal(s), diffusion barrier(s) and the like. A conductor metal 184 is formed over the other materials 182, as shown.

In recent years, monolithic stacked transistor architectures have been used that use three-dimensional multi-gate structures, such as FinFETs. The transistors in such architectures may be formed in both an upper device layer and a lower device layer, and therefore, may be referred to as a vertically integrated semiconductors.

Figure 2:
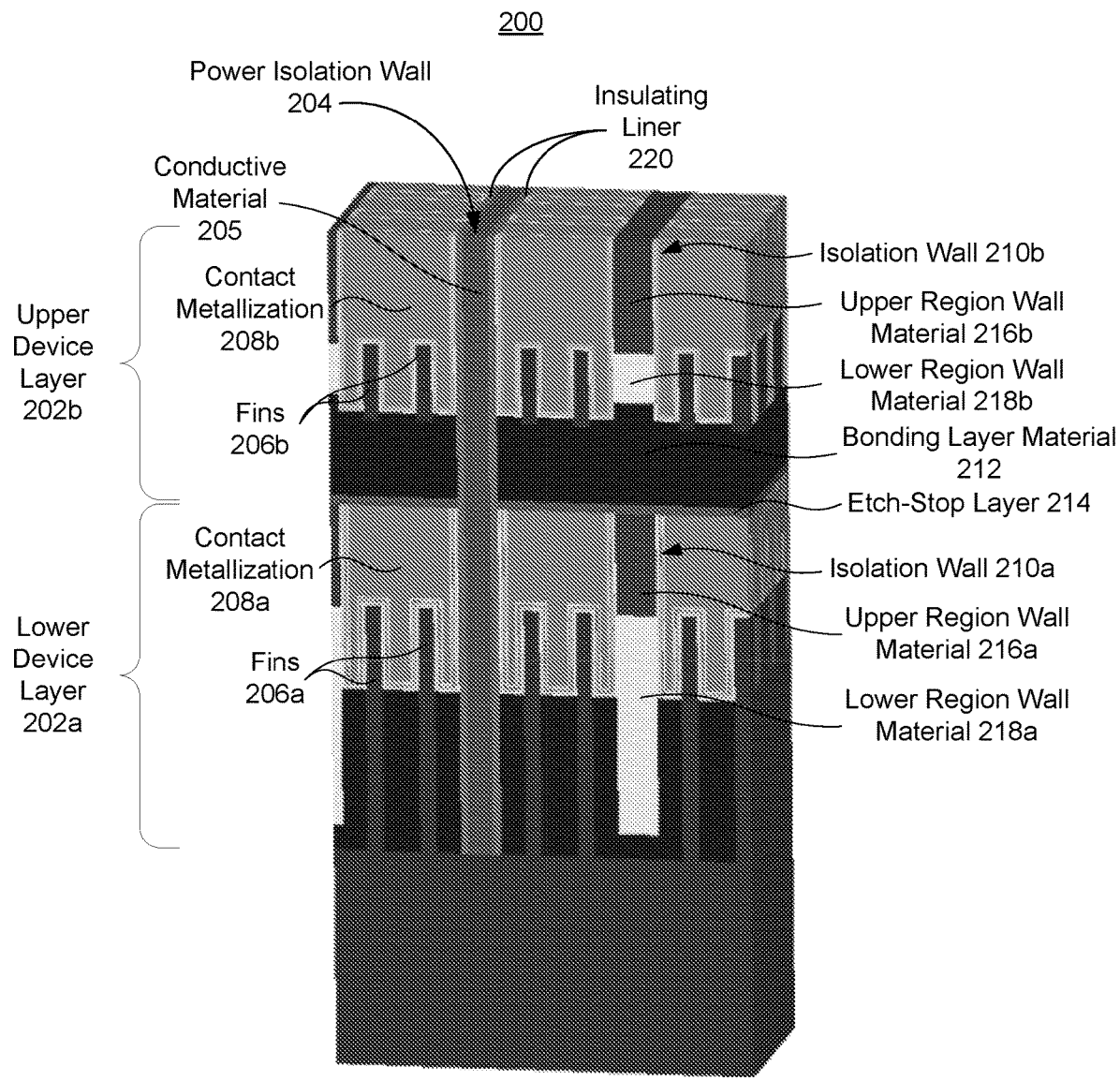
FIG. 2 is a three-dimensional view illustrating a lateral cross-section of a stacked device architecture according to one embodiment.

FIG. 2 is a three-dimensional view illustrating a lateral cross-section of a stacked device architecture according to one embodiment. The stacked device architecture 200 comprises vertically stacked fin-type transistor devices formed in a lower device layer 202a and in an upper device layer 202b. The lower device layer 202a includes a first structure comprising a first set of vertical transistor fins 206a, a first set of contact metallization 208a (e.g., gate contacts), and an optional first set of one or more vertical isolation walls 210a. The upper device layer 202b includes a second structure comprising a second set of vertical transistor fins 206b, a second set of contact metallization 208b, and an optional second set of one or more isolation walls 210b. In one embodiment, the transistor fins 206a 206b and the contact metallization 208a 208b form fin-type non-planar transistors on the lower and upper device layers 202a 202b, respectively.

Any combination of the fin-type non-planar transistors of FIGS. 1A-1E may be stacked. For example, in one embodiment, the lower device layer 202a may include bulk FinFETs 176, while the top device layer 202b includes SOI FinFETs 186 starting at the bonding layer 190. In a second embodiment, the lower device layer 202a may include SOI FinFETs 186, while the top device layer 202b includes bulk FinFETs 176. In a third embodiment, the lower device layer 202a may include SOI FinFETs 186, while the top device layer 202b includes TFT devices. And in a fourth embodiment, both the lower and upper device layers 202a 202b may include SOI FinFETs 186, bulk FinFETs, or TFT devices.

The upper device layer 202b is bonded onto the lower device layer 202a. Accordingly, the upper device layer 202b includes a bonding layer material 212, which may comprise an oxide, and an etch-stop layer material 214, which may comprise a nitride. In one embodiment, the lower-level of transistors are conventionally fabricated, and then a second layer of monocrystalline silicon or other semiconductor material may be layer transferred and oxide-oxide low temperature bonded to the top of the lower-level dielectric.

While the use of a vertically integrated semiconductor may reduce overall footprint of the device, there is very little space available within which metal routing can be formed between the upper device layer and the lower device layer. One known approach for routing metal from the upper device layer to the lower device layer utilizes a wrap-around interconnect. However, the use of wrap-around interconnects tends to increase the cross-sectional footprint of the overall device and necessitates larger spacing between the components of the semiconductor, thereby eliminating many of the density benefits of vertical device stacking.

According to the disclosed embodiments, the stacked device architecture 200 further includes at least one power isolation wall 204 that extends from a top of the upper device layer 202b to the bottom of the lower device layer 202a and is filled with a conductive material 205 such that power, and optionally signals, may be routed between transistors on the upper device layer 202b and the lower device layer 202a. In one embodiment, the conductive material 205 has low resistivity and may comprise one or more of tungsten, copper, titanium or titanium nitride.

In one embodiment, the power isolation wall 204 may also include an insulating liner 220 formed conformal to sidewalls of the power isolation wall 204, as shown in FIG. 2. The insulating liner 220 may be used to prevent conduction to materials adjacent to the power isolation wall 204. The insulating liner 220 may comprise a dielectric material such as an oxide or a nitride material.

In one embodiment, the stacked device architecture 200 may further include optional insulating isolation walls 210a and 210b in one or both of the upper and lower device layers 202a and 202b to isolate various transistor devices in the corresponding layer. The insulating isolation walls 210a and 210b are formed as cavities in the upper and lower device layers 202a and 202b and are filled with one or more dielectric materials. For example, isolation wall 210a may be filled with a lower region wall material 216a and upper region wall material 218a. Likewise, isolation wall 210b may be filled with a lower region wall material 216b and upper region wall material 218b. In one embodiment, the lower region wall materials 218a and 218b and the upper region wall materials 216a and 216b may comprise titanium nitride or other nitrides oxides and carbides.

In one embodiment, the location of one or more isolation walls 210b in the upper device layer 202b are intentionally aligned with locations of corresponding isolation walls 210a in the lower device layer 202a. Although FIG. 2 only shows two isolation walls 210a and 210b within the stacked device architecture 200, any number may be present.

Figure 3A:
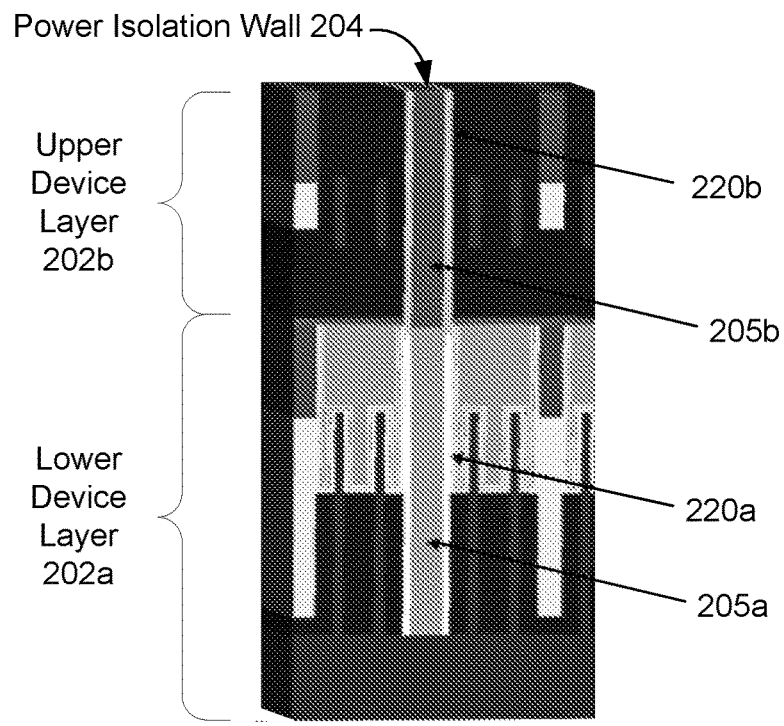
FIG. 3A illustrates an embodiment where the materials filling the power isolation wall in the lower device layer differ from the materials filling the power isolation wall in the upper device layer.

FIG. 3A illustrates an embodiment where the materials filling the power isolation wall 204 in the lower device layer 202a differ from the materials filling the power isolation wall 204 in the upper device layer 202b. In this embodiment, the power isolation wall 204 in the lower device layer comprises a first type of insulating liner 220a and a first type of conducting material 205a, while the power isolation wall 204 in the upper device layer 202b comprises a second type of insulating liner 220b and a second type of conducting material 205b that are different than those in the lower device layer 202a. For example, the first type of conducting metal 205a in the power isolation wall 204 in the lower device layer 202a may comprise a non-metal conductor such as titanium nitride, while the second type of conducting metal 205b in the power isolation wall 204 in the upper device layer 202b may comprise tungsten. As a second example, the first type of conducting metal 205a in the power isolation wall 204 in the lower device layer 202a may comprise tungsten, while the second type of conducting metal 205b in the power isolation wall 204 in the upper device layer 202b may comprise copper. An electrical junction (not shown) may be located between the two different types of conducting metals 205a 205b.

Figure 3B:
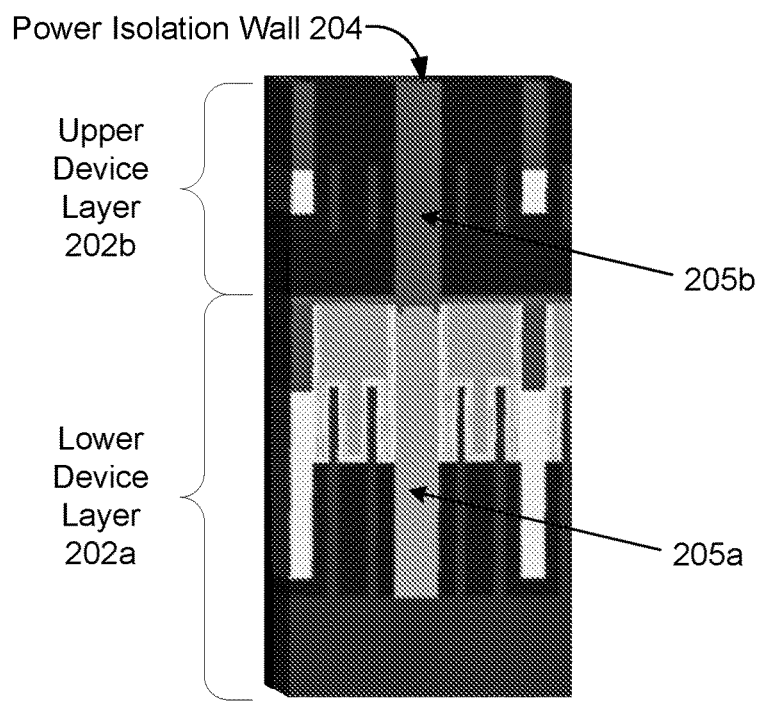
FIG. 3B illustrates another embodiment where the power isolation wall 204 is formed without an insulating liner.

FIG. 3B illustrates another embodiment where the power isolation wall 204 is formed without an insulating liner. As an example, the power isolation wall 204 may not need the insulating liner when there is an insulator is adjacent to the power isolation wall 204. In addition, the power isolation wall 204 is shown in the embodiment where the power isolation wall 204 is filled with different conducting metals 205a 205b in the lower and upper device layers 202a 202b, respectively.

FIGS. 4A-4I are illustrative cross-sectional views representing various operations for fabricating an integrated device structure comprising a vertically stacked transistor device architecture with a conducting power isolation wall according to one embodiment.

Figure 4A:
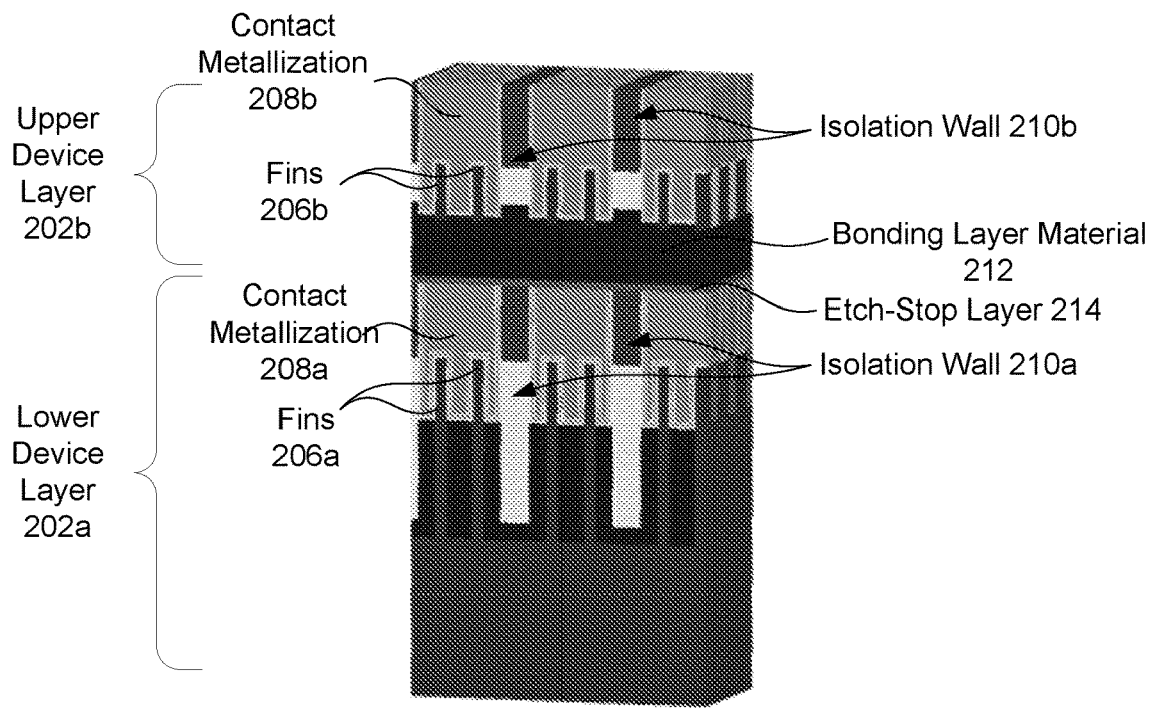
FIGS. 4A-4I are illustrative cross-sectional views representing various operations for fabricating an integrated device structure comprising a vertically stacked transistor device architecture with a conducting power isolation wall according to one embodiment.

The process may begin by forming a vertically stacked device architecture having a completely formed lower device layer and at least a partially formed upper device layer bonded onto the lower device layer. Referring to FIG. 4A, in lower device layer 202a a first structure is formed comprising a first set of vertical transistor fins 206a, a first set of contact metallization 208a, and an optional first set of one or more insulating isolation walls 210a. In the upper device layer 202b a second structure is formed comprising a second set of vertical transistor fins 206b, a second set of contact metallization 208b, and an optional second set of one or more insulating isolation walls 210b.

Figure 4B:
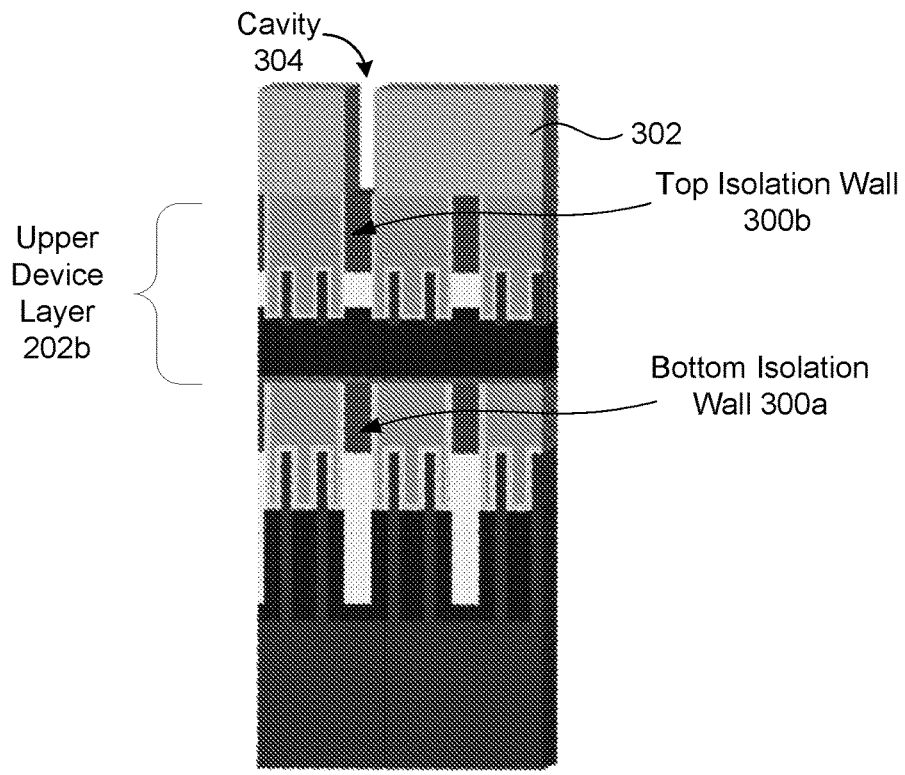

Referring to FIG. 4B, structures in the upper device layer are lithographically masked off with an etch resistant layer 302, where the structures are other than a selected top insulating isolation wall 300b, which is vertically aligned with a bottom isolation wall 300a from the lower device layer 202a. The two vertically aligned isolation walls 300a and 300b will form one power isolation wall.

Figure 4C:
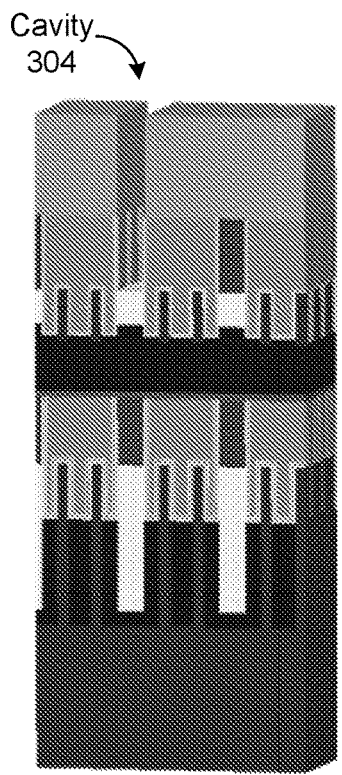
Figure 4D:
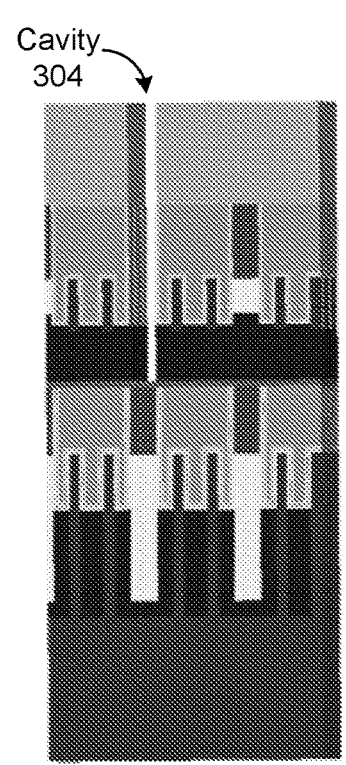

In the embodiment shown, both the bottom isolation wall 300a and the top isolation wall 300b are filled with a lower region wall material 218 and upper region wall material 216 (FIG. 2), but could be filled with a single type of material. The upper region wall material of the top isolation wall 300b may comprise a material that is selected for its' etch selectivity to the type of dielectric material adjacent to the top isolation wall 210b. In one embodiment, the upper region wall material may comprise titanium nitride, however other nitrides oxides and carbides are also acceptable Materials filling the top isolation wall 300b are then etched away to form a cavity 304, as shown in FIGS. 4C and 4D. FIG. 4C shows etching of the upper region wall material of the top isolation wall 300b, while FIG. 4D shows etching of the lower region wall material of the top isolation wall 300b, which completes removal of the top isolation wall 300b. FIG. 4D also shows etching of the bonding layer material 212 and the etch-stop layer 214 to extend the cavity 304 to the top of the lower device layer 202a. Alternatively, if the top isolation wall 300b is filled with a single type of material, then the top isolation wall 300b may be etched down to the bonding layer material 212 in a single step.

Figure 4E:
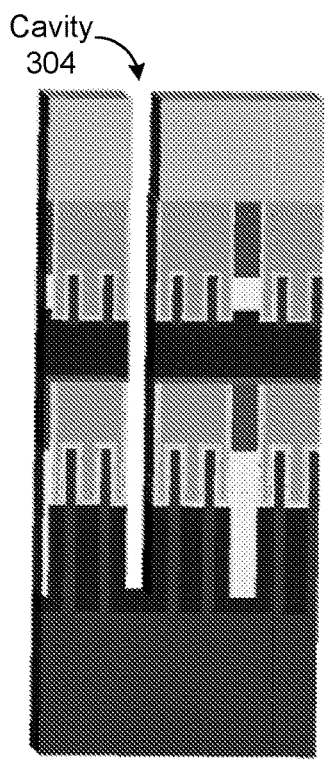
Figure 4F:
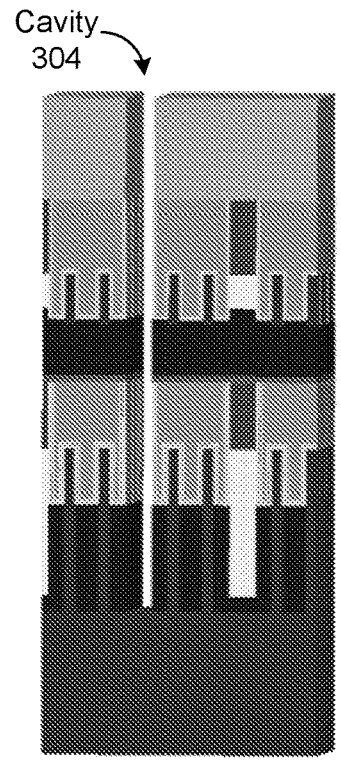

Thereafter, materials filling the bottom isolation wall 300a are etched, as shown in FIG. 4E. Both the upper region wall material and the lower region wall material are etched from the bottom isolation wall 300a in one or more steps. A bottom insulating layer is etched to extend the cavity 304 from the upper device layer 202b through the bottom device layer 202a, as shown in FIG. 4F.

Figure 4G:
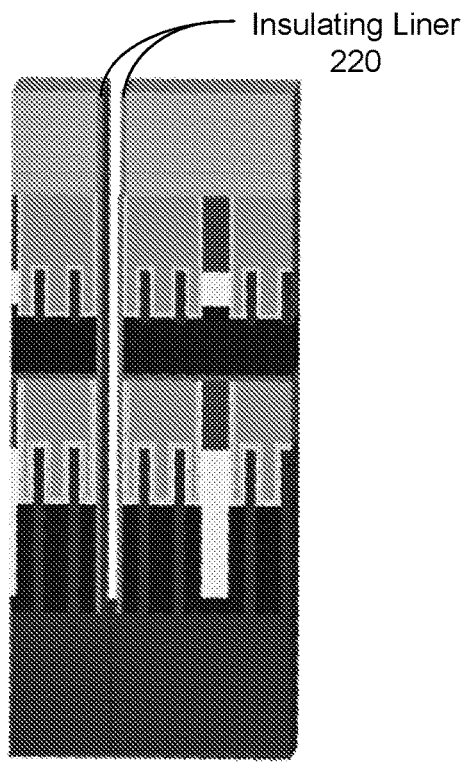

Following evacuation of the upper and lower region wall materials, the optional insulating liner 220 may be formed conformal to sidewalls of the cavity 304, as shown in FIG. 4G. In one embodiment, the insulating liner 220 comprise a dielectric material that may be formed as a spacer. In one embodiment, the insulating liner may be referred to as an adhesion layer or diffusion block layer. The dielectric material may comprise an oxide or a nitride material.

Figure 4H:
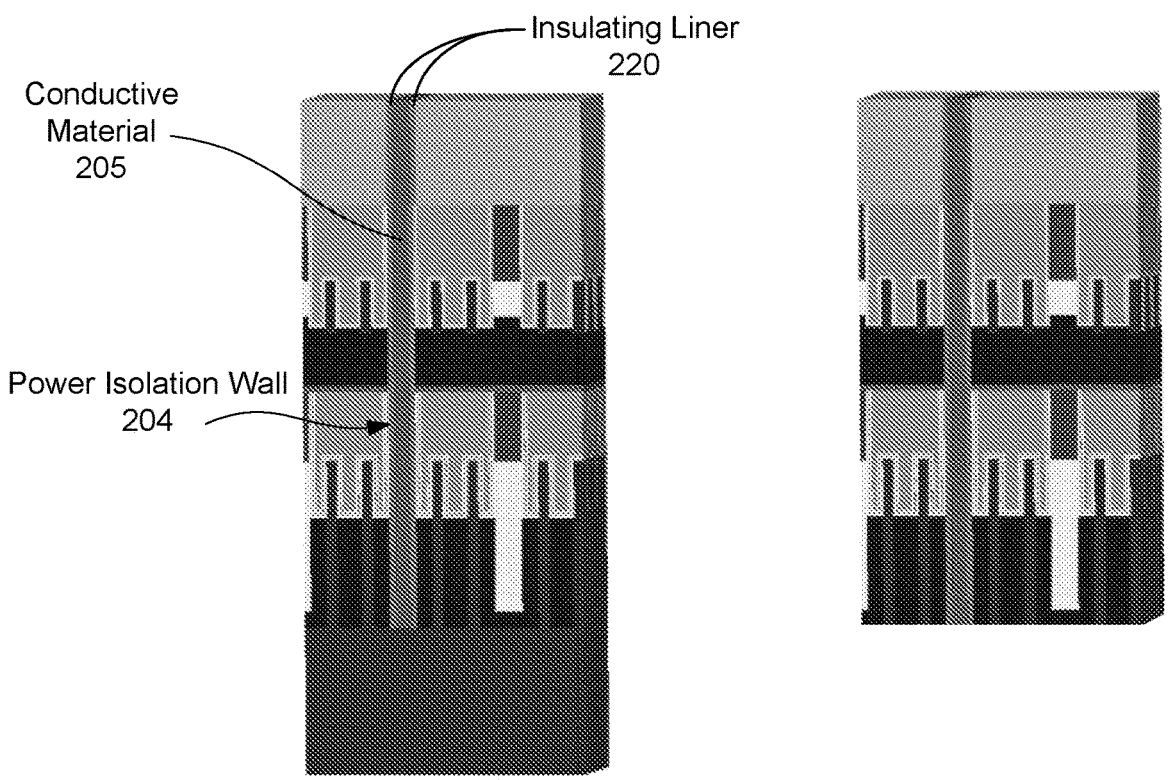

The optionally lined cavity 304 is filled with a conductive material 205 (i.e., metal or a non-metal conductor) to form the power isolation wall 204, as shown in FIG. 4H. In one embodiment, the conductive material comprises a material that has low resistivity such as tungsten, copper, titanium or titanium nitride. One purpose of the conductive material is to route power between the lower device layer and the upper device layer. However in a further embodiment, the conductive material may be used to also route signals.

At this stage the power isolation wall 204 has been formed within the stacked transistor device assembly that extends at least two device levels. The stacked transistor device assembly includes one or more power isolation walls 204 and in some embodiments, one or more insulating isolation walls. In one embodiment, the power isolation walls 204 may need to be wider than the non-conductive isolation walls 210. The width of the power isolation wall 204 may be determined by the aspect ratio of the metal fill required to fill regions 205a and 205b. The width of regions 205a and 205b may also be chosen to achieve an acceptable electrical resistance through the conductive regions 205a and 205b. For purposes of example, the conductive power isolation wall 204 may require a width of 8-30 nm (width of region 205a/205b) in order to provide for acceptable electrical resistance and metal fill while the non-conductive isolation walls 210 may be 5-20 nm in width.

Figure 4I:
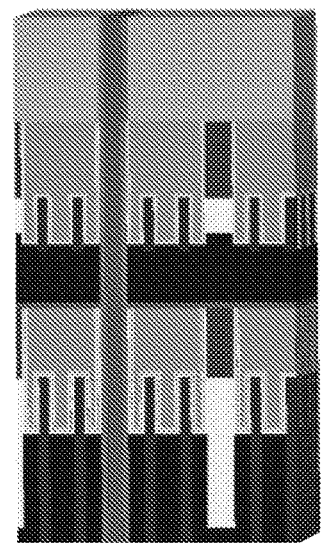

FIG. 4I shows an alternative embodiment where the stacked transistor device assembly is inverted and polished from the backside using traditional chemical mechanical polishing techniques to remove materials below the bottom of the power isolation wall 204. This step exposes both the top and the bottom of the power isolation wall 204 so that electrical connections (not shown) may be formed to either side of the assembly to route to laterally adjacent devices.

In this embodiment, the materials filling both the lower device layer and the upper device layer are the same. It should be apparent to one skilled in the art, however, than other representative structures could be formed. For example, fabrication of the power isolation walls 204 may occur following completion of, or during fabrication of, the lower device layer, but before completion of the upper device layer. This means that in one embodiment different materials may be used on the lower and upper device layers of the power isolation walls 204.

In another aspect, the integrated circuit structures described herein may be included in an electronic device. As a first example of an apparatus that may include the vertically stacked transistor device architecture with a conducting power isolation wall disclosed herein, FIGS. 5A and 5B are top views of a wafer and dies that include a vertically stacked transistor device architecture with one or more conducting power isolation walls, in accordance with any of the embodiments disclosed herein.

Figure 5B:
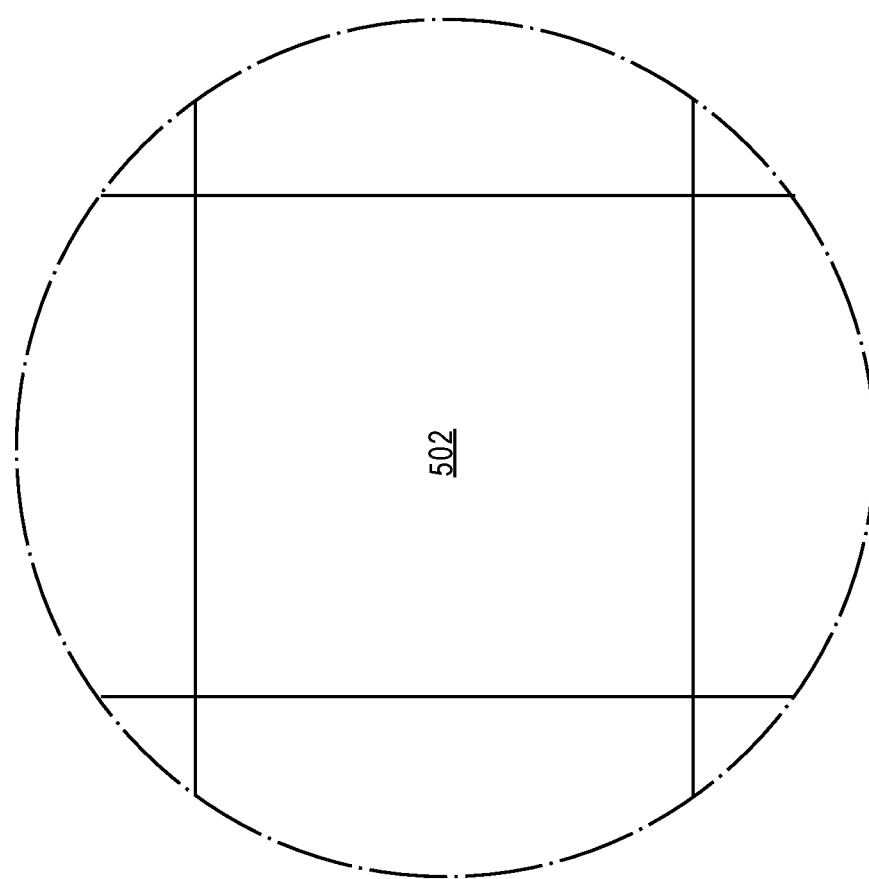
FIGS. 5A and 5B are top views of a wafer and dies that a vertically stacked transistor device architecture with a conducting power isolation wall, in accordance with one or more of the embodiments disclosed herein.
Figure 5A:
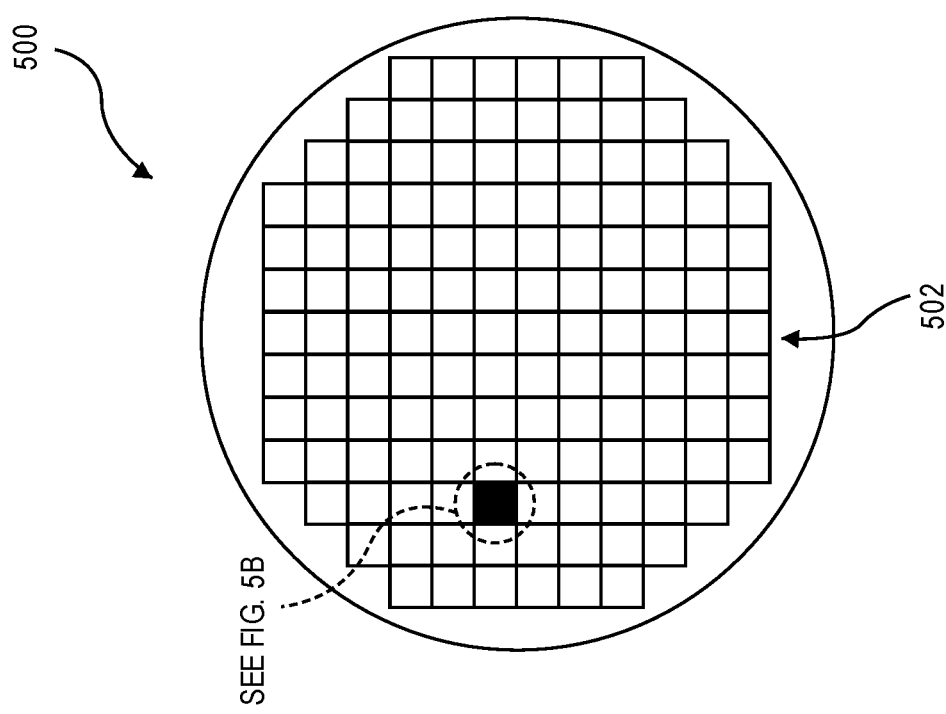

Referring to FIGS. 5A and 5B, a wafer 500 may be composed of semiconductor material and may include one or more dies 502 having integrated circuit (IC) structures formed on a surface of the wafer 500. Each of the dies 502 may be a repeating unit of a semiconductor product that includes any suitable IC (e.g., ICs including one or more structures such as structures 150, 170, 200 or 300). After the fabrication of the semiconductor product is complete (e.g., after manufacture of structures 150, 170, 200 or 300), the wafer 500 may undergo a singulation process in which each of the dies 502 is separated from one another to provide discrete "chips" of the semiconductor product. In particular, devices that include a vertically stacked transistor device architecture with one or more conducting power isolation walls as disclosed herein may take the form of the wafer 500 (e.g., not singulated) or the form of the die 502 (e.g., singulated). The die 502 may include one or more transistors and/or supporting circuitry to route electrical signals to the transistors, as well as any other IC components. In some embodiments, the wafer 500 or the die 502 may include a memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Figure 6:
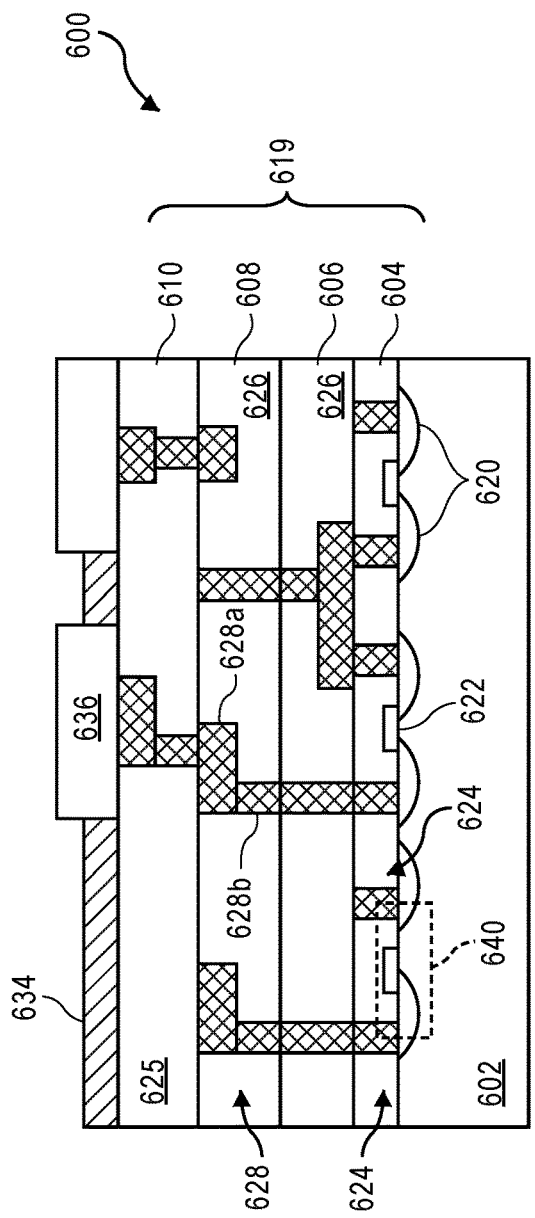
FIG. 6 is a cross-sectional side view of an integrated circuit (IC) device that may include a vertically stacked transistor device architecture with a conducting power isolation wall, in accordance with one or more of the embodiments disclosed herein.

FIG. 6 is a cross-sectional side view of an integrated circuit (IC) device that may include a vertically stacked transistor device architecture with one or more conducting power isolation walls, in accordance with one or more of the embodiments disclosed herein.

Referring to FIG. 6, an IC device 600 is formed on a substrate 602 (e.g., the wafer 500 of FIG. 5A) and may be included in a die (e.g., the die 502 of FIG. 5B), which may be singulated or included in a wafer. Although a few examples of materials from which the substrate 602 may be formed are described above in association with substrate 152, 202, 302 or 400, any material that may serve as a foundation for an IC device 600 may be used.

The IC device 600 may include one or more device layers, such as device layer 604, disposed on the substrate 602. The device layer 604 may include features of one or more transistors 640 (e.g., a vertically stacked transistor device architecture with one or more conducting power isolation walls described above) formed on the substrate 602. The device layer 604 may include, for example, one or more source and/or drain (S/D) regions 620, a gate 622 to control current flow in the transistors 640 between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and may include a wide variety of other types and configurations such as, for example, planar transistors, non-planar transistors, or a combination of both. Non-planar transistors may include fin-based transistors, such as double-gate transistors or tri-gate transistors, and wrap-around or all-around gate transistors, such as nanoribbon and nanowire transistors.

Electrical signals, such as power and/or input/output (I/O) signals, may be routed to and/or from the transistors 640 of the device layer 604 through one or more interconnect layers disposed on the device layer 604 (illustrated in FIG. 6 as interconnect layers 606-610), where at least one of the interconnect layers includes a conducting power isolation wall. For example, electrically conductive features of the device layer 604 (e.g., the gate 622 and the S/D contacts 624) may be electrically coupled with the interconnect structures 628 of the interconnect layers 606-610. The one or more interconnect layers 606-610 may form an interlayer dielectric (ILD) stack 619 of the IC device 600.

The interconnect structures 628 may be arranged within the interconnect layers 606-610 to route electrical signals according to a wide variety of designs (in particular, the arrangement is not limited to the particular configuration of interconnect structures 628 depicted in FIG. 6). Although a particular number of interconnect layers 606-610 is depicted in FIG. 6, embodiments of the present disclosure include IC devices having more or fewer interconnect layers than depicted.

In some embodiments, the interconnect structures 628 may include trench structures 628a (sometimes referred to as "lines") and/or via structures 628b filled with an electrically conductive material such as a metal. The trench structures 628a may be arranged to route electrical signals in a direction of a plane that is substantially parallel with a surface of the substrate 602 upon which the device layer 604 is formed. For example, the trench structures 628a may route electrical signals in a direction in and out of the page from the perspective of FIG. 6. The via structures 628b may be arranged to route electrical signals in a direction of a plane that is substantially perpendicular to the surface of the substrate 602 upon which the device layer 604 is formed. In some embodiments, the via structures 628b may electrically couple trench structures 628a of different interconnect layers 606-610 together.

The interconnect layers 606-610 may include a dielectric material 626 disposed between the interconnect structures 628, as shown in FIG. 6. In some embodiments, the dielectric material 626 disposed between the interconnect structures 628 in different ones of the interconnect layers 606-610 may have different compositions; in other embodiments, the composition of the dielectric material 626 between different interconnect layers 606-610 may be the same. In either case, such dielectric materials may be referred to as inter-layer dielectric (ILD) materials.

A first interconnect layer 606 (referred to as Metal 1 or "M1") may be formed directly on the device layer 604. In some embodiments, the first interconnect layer 606 may include trench structures 628a and/or via structures 628b, as shown. The trench structures 628a of the first interconnect layer 606 may be coupled with contacts (e.g., the S/D contacts 624) of the device layer 604.

A second interconnect layer 608 (referred to as Metal 2 or "M2") may be formed directly on the first interconnect layer 606. In some embodiments, the second interconnect layer 608 may include via structures 628b to couple the trench structures 628a of the second interconnect layer 608 with the trench structures 628a of the first interconnect layer 606. Although the trench structures 628a and the via structures 628b are structurally delineated with a line within each interconnect layer (e.g., within the second interconnect layer 608) for the sake of clarity, the trench structures 628a and the via structures 628b may be structurally and/or materially contiguous (e.g., simultaneously filled during a dual-damascene process) in some embodiments.

A conducting power isolation wall may be formed, for example, on M1 and M2 or higher to transmit power between the transistors on M1 and the transistors on M2.

A third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606.

The IC device 600 may include a solder resist material 634 (e.g., polyimide or similar material) and one or more bond pads 636 formed on the interconnect layers 606-610. The bond pads 636 may be electrically coupled with the interconnect structures 628 and configured to route the electrical signals of the transistor(s) 640 to other external devices. For example, solder bonds may be formed on the one or more bond pads 636 to mechanically and/or electrically couple a chip including the IC device 600 with another component (e.g., a circuit board). The IC device 600 may have other alternative configurations to route the electrical signals from the interconnect layers 606-610 than depicted in other embodiments. For example, the bond pads 636 may be replaced by or may further include other analogous features (e.g., posts) that route the electrical signals to external components.

Figure 7:
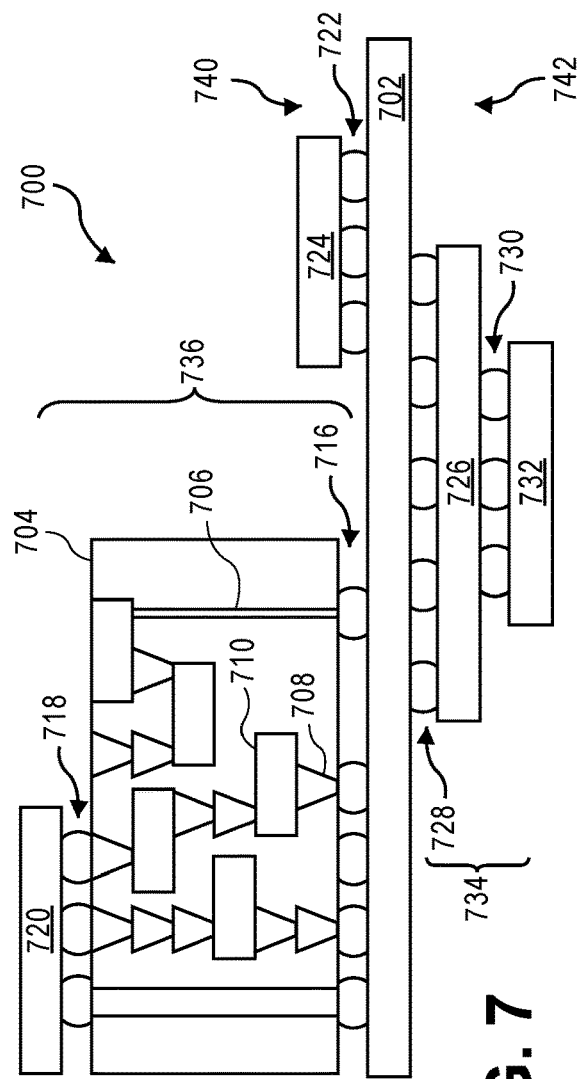
FIG. 7 is a cross-sectional side view of an integrated circuit (IC) device assembly that may a vertically stacked transistor device architecture with a conducting power isolation wall, in accordance with one or more of the embodiments disclosed herein.

FIG. 7 is a cross-sectional side view of an integrated circuit (IC) device assembly that may include a vertically stacked transistor device architecture with one or more conducting power isolation walls, in accordance with one or more of the embodiments disclosed herein.

Referring to FIG. 7, an IC device assembly 700 includes components having one or more integrated circuit structures described herein. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include a number of the TFT structures 150, 170, 200 or 300 disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 502 of FIG. 5B), an IC device (e.g., the IC device 600 of FIG. 6), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through-silicon vias (TSVs) 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
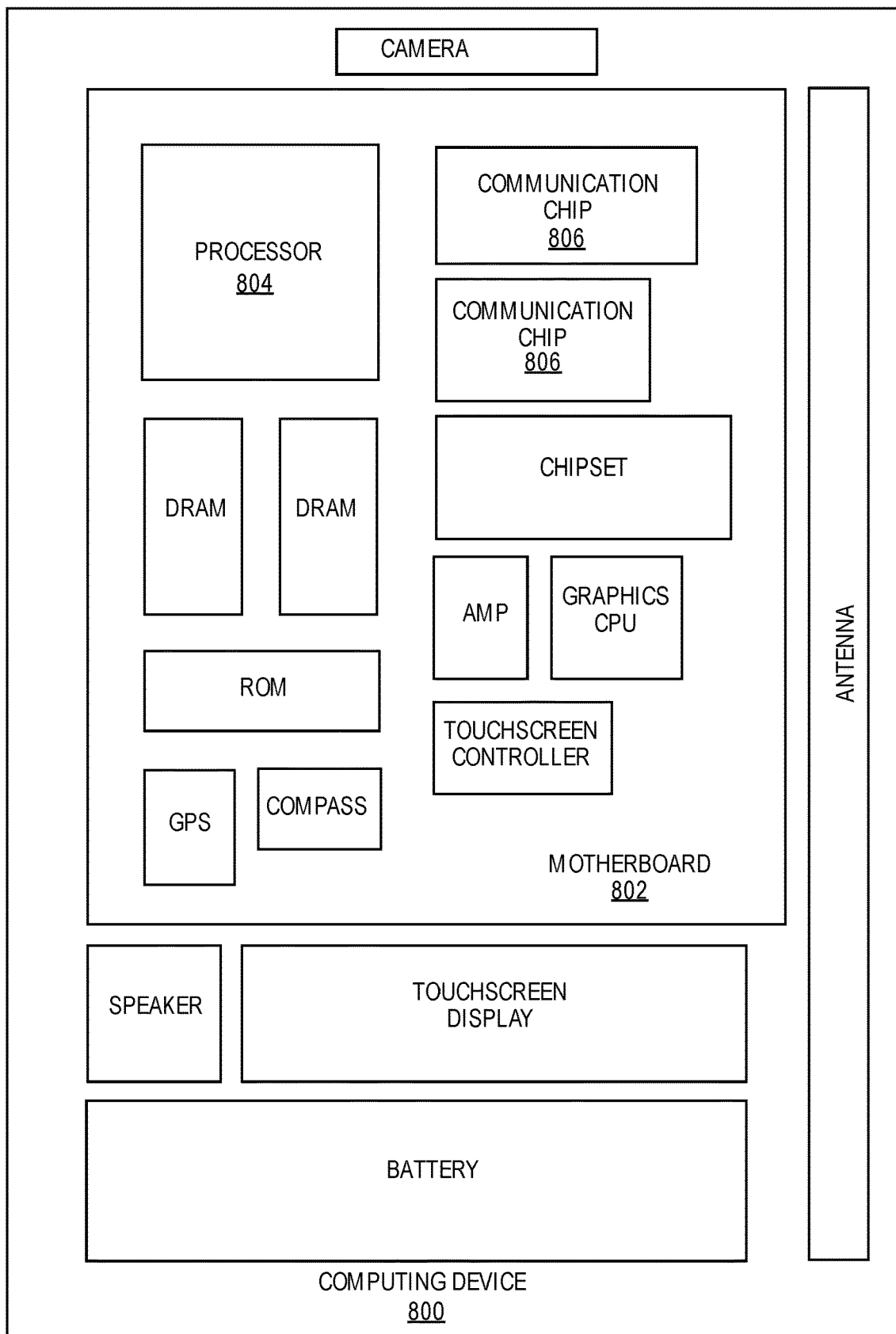
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes a vertically stacked transistor device architecture with one or more conducting power isolation walls, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more thin film transistors having relatively increased width, in accordance with implementations of embodiments of the disclosure.

In further implementations, another component housed within the computing device 800 may contain an integrated circuit die that includes a vertically stacked transistor device architecture with one or more conducting power isolation walls, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments described herein a vertically stacked transistor device architecture with one or more conducting power isolation walls. The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure comprises a lower device layer that includes a first structure comprising a first set of transistor fins and a first set of contact metallization. An upper device layer is bonded onto the lower device layer, where the upper device layer includes a second structure comprising a second set of transistor fins and a second set of contact metallization. At least one power isolation wall extends from a top of the upper device layer to the bottom of the lower device layer, wherein the power isolation wall is filled with a conductive material such that power is routed between transistor devices on the upper device layer and the lower device layer.

Example Embodiment 2

The integrated circuit structure of example embodiment 1, wherein the power isolation wall routes signals in addition to the power.

Example Embodiment 3

The integrated circuit structure of example embodiment 1 or 2, wherein the conductive material filling the at least one power isolation wall comprises one or more of tungsten, copper, titanium or titanium nitride.

Example Embodiment 4

The integrated circuit structure of example embodiment 1, 2, or 3, further including an insulating liner conformal to sidewalls of the at least one power isolation wall.

Example Embodiment 5

The integrated circuit structure of example embodiment 4, wherein the insulating liner comprises a dielectric material.

Example Embodiment 6

The integrated circuit structure of example embodiment 1, 2, 3, or 4, wherein the at least one power isolation wall is filled with a lower region conducting material and an upper region conducting material.

Example Embodiment 7

The integrated circuit structure of example embodiment 1, 2, 3, 4, 5, or 6, wherein the at least one power isolation wall in the lower device layer comprises a first type of insulating liner and a first type of conducting metal, and wherein the at least one power isolation wall in the upper device layer comprises a second type of insulating liner and a second type of conducting metal.

Example Embodiment 8

The integrated circuit structure of example embodiment 7, further including an electrical junction located between the first type of conducting metal and the second type of conducting metal.

Example Embodiment 9

The integrated circuit structure of example embodiment 1, 2, 3, 4, 5, 6, 7, or 8, wherein the first structure in the lower device layer further includes a first set of one or more insulating isolation walls that are filled with one or more insulating dielectric materials.

Example Embodiment 10

The integrated circuit structure of example embodiment 9, wherein the one or more dielectric materials comprises a lower region wall material and upper region wall material.

Example Embodiment 11

The integrated circuit structure of example embodiment 1, 2, 3, 4, 5, 6, 7, 8, or 9, wherein the second structure in the upper device layer further includes a second set of one or more insulating isolation walls that are filled with one or more dielectric materials.

Example Embodiment 12

The integrated circuit structure of example embodiment 11, wherein the one or more dielectric materials comprises a lower region wall material and upper region wall material.

Example Embodiment 13

An integrated circuit structure comprises a lower device layer that includes a first structure comprising a first set of transistor fins, a first set of contact metallization, and a first set of one or more insulation isolation walls. An upper device layer is bonded onto the lower device layer, where the upper device layer includes a second structure comprising a second set of transistor fins, a second set of contact metallization and a second set of one or more insulation isolation walls in the upper device layer. A power isolation wall extends from a top of the upper device layer to the bottom of the lower device layer, wherein the power isolation wall is filled with a conductive material such that power and signals are routed between transistor devices on the upper device layer and the lower device layer.

Example Embodiment 14

The integrated circuit structure of example embodiment 13, wherein the conductive material filling the at least one power isolation wall comprises one or more of tungsten, copper, titanium or titanium nitride.

Example Embodiment 15

The integrated circuit structure of example embodiment 13 or 14, further including an insulating liner conformal to sidewalls of the at least one power isolation wall.

Example Embodiment 16

The integrated circuit structure of example embodiment 15, wherein the insulating liner comprises a dielectric material.

Example Embodiment 17

The integrated circuit structure of example embodiment 13, 14, 15, or 16, wherein the at least one power isolation wall is filled with a lower region conducting material and an upper region conducting material.

Example Embodiment 18

The integrated circuit structure of example embodiment 13, 14, 15, 16, or 17, wherein the at least one power isolation wall in the lower device layer comprises a first type of insulating liner and a first type of conducting metal, and wherein the at least one power isolation wall in the upper device layer comprises a second type of insulating liner and a second type of conducting metal.

Example Embodiment 19

The integrated circuit structure of example embodiment 18, further including an electrical junction located between the first type of conducting metal and the second type of conducting metal.

Example Embodiment 20

The integrated circuit structure of example embodiment 13, 14, 15, 16, 17, 18, or 19, wherein the first set of one or more insulating isolation walls and the second set of one or more insulating isolation walls are filled with one or more insulating dielectric materials.

Example Embodiment 21

The integrated circuit structure of example embodiment 20, wherein the one or more dielectric materials comprises a lower region wall material and upper region wall material.

Example Embodiment 22

A method of fabricating an integrated device structure comprising a vertically stacked transistor device architecture with a conducting power isolation wall includes forming a vertically stacked device architecture having a lower device layer and at least a partially formed upper device layer bonded onto the lower device layer. In the lower device layer, a first structure is formed comprising a first set of transistor fins, a first set of contact metallization, and a first set of one or more insulating isolation walls. In the upper device layer, a second structure is formed comprising a second set of transistor fins, a second set of contact metallization, and a second set of one or more insulating isolation walls. Structures are masked off in the upper device layer with an etch resistant layer, other than a particular one of the bottom insulating isolation walls in the upper device layer that is vertically aligned with a particular one of the bottom isolation walls. Materials filling the particular one of the insulating isolation walls are etched to form a cavity. Materials filling the particular one of the bottom insulating isolation wall are etched to extend the cavity from the upper device layer through the bottom device layer. The cavity is filled with a conductive metal to form the power isolation wall that routes power between the lower device layer and the upper device layer.

Example Embodiment 23

The method of example embodiment 22, further comprising forming an insulating liner conformal to sidewalls of the cavity prior to filling the cavity with the conductive metal.

Example Embodiment 24

The method of example embodiment 22 or 23, further comprising using the power isolation wall to route both power and signals between the lower device layer and the upper device layer Example Embodiment 25

The method of example embodiment 22, 23 or 24, further comprising using one or more of tungsten, copper, titanium or titanium nitride as the conductive metal.

What is claimed is:

1. An integrated circuit structure, comprising:
a lower device layer that includes a first structure comprising a first set of transistor fins and a first set of contact metallization;
an upper device layer bonded onto the lower device layer, the upper device layer including a second structure comprising a second set of transistor fins and a second set of contact metallization; and
at least one power isolation wall that extends from a top of the upper device layer to the bottom of the lower device layer, wherein the power isolation wall is filled with a conductive material such that power is routed between transistor devices on the upper device layer and the lower device layer.

2. The integrated circuit structure of claim 1, wherein the power isolation wall routes signals in addition to the power.

3. The integrated circuit structure of claim 1, wherein the conductive material filling the at least one power isolation wall comprises one or more of tungsten, copper, titanium or titanium nitride.

4. The integrated circuit structure of claim 1, further including an insulating liner conformal to sidewalls of the at least one power isolation wall.

5. The integrated circuit structure of claim 4, wherein the insulating liner comprises a dielectric material.

6. The integrated circuit structure of claim 1, wherein the at least one power isolation wall is filled with a lower region conducting material and an upper region conducting material.

7. The integrated circuit structure of claim 1, wherein the at least one power isolation wall in the lower device layer comprises a first type of insulating liner and a first type of conducting metal, and wherein the at least one power isolation wall in the upper device layer comprises a second type of insulating liner and a second type of conducting metal.

8. The integrated circuit structure of claim 7, further including an electrical junction located between the first type of conducting metal and the second type of conducting metal.

9. The integrated circuit structure of claim 1, wherein the first structure in the lower device layer further includes a first set of one or more insulating isolation walls that are filled with one or more insulating dielectric materials.

10. The integrated circuit structure of claim 9, wherein the one or more dielectric materials comprises a lower region wall material and upper region wall material.

11. The integrated circuit structure of claim 1, wherein the second structure in the upper device layer further includes a second set of one or more insulating isolation walls that are filled with one or more dielectric materials.

12. The integrated circuit structure of claim 11, wherein the one or more dielectric materials comprises a lower region wall material and upper region wall material.

13. An integrated circuit structure, comprising:
a lower device layer that includes a first structure comprising a first set of transistor fins, a first set of contact metallization, and a first set of one or more insulation isolation walls;
an upper device layer bonded onto the lower device layer, the upper device layer includes a second structure comprising a second set of transistor fins, a second set of contact metallization and a second set of one or more insulation isolation walls in the upper device layer; and a power isolation wall that extends from a top of the upper device layer to the bottom of the lower device layer, wherein the power isolation wall is filled with a conductive material such that power and signals are routed between transistor devices on the upper device layer and the lower device layer.

14. The integrated circuit structure of claim 13, wherein the conductive material filling the at least one power isolation wall comprises one or more of tungsten, copper, titanium or titanium nitride.

15. The integrated circuit structure of claim 13, further including an insulating liner conformal to sidewalls of the at least one power isolation wall.

16. The integrated circuit structure of claim 15, wherein the insulating liner comprises a dielectric material.

17. The integrated circuit structure of claim 13, wherein the at least one power isolation wall is filled with a lower region conducting material and an upper region conducting material.

18. The integrated circuit structure of claim 13, wherein the at least one power isolation wall in the lower device layer comprises a first type of insulating liner and a first type of conducting metal, and wherein the at least one power isolation wall in the upper device layer comprises a second type of insulating liner and a second type of conducting metal.

19. The integrated circuit structure of claim 18, further including an electrical junction located between the first type of conducting metal and the second type of conducting metal.

20. The integrated circuit structure of claim 13, wherein the first set of one or more insulating isolation walls and the second set of one or more insulating isolation walls are filled with one or more insulating dielectric materials.

21. The integrated circuit structure of claim 20, wherein the one or more dielectric materials comprises a lower region wall material and upper region wall material.

22. A method of fabricating an integrated device structure comprising a vertically stacked transistor device architecture with a conducting power isolation wall, the method comprising:

forming a vertically stacked device architecture having a lower device layer and at least a partially formed upper device layer bonded onto the lower device layer;

forming in the lower device layer, a first structure comprising a first set of transistor fins, a first set of contact metallization, and a first set of one or more insulating isolation walls;

forming in the upper device layer, a second structure comprising a second set of transistor fins, a second set of contact metallization, and a second set of one or more insulating isolation walls;

masking off structures in the upper device layer with an etch resistant layer other than a particular one of the bottom insulating isolation walls in the upper device layer that is vertically aligned with a particular one of the bottom isolation walls;

etching materials filling the particular one of the insulating isolation walls to form a cavity;

etching materials filling the particular one of the bottom insulating isolation wall to extend the cavity from the upper device layer through the bottom device layer; and filling the cavity with a conductive metal to form the power isolation wall that routes power between the lower device layer and the upper device layer.

23. The method of claim 22, further comprising forming an insulating liner conformal to sidewalls of the cavity prior to filling the cavity with the conductive metal.

24. The method of claim 22, further comprising using the power isolation wall to route both power and signals between the lower device layer and the upper device layer.

25. The method of claim 22, further comprising using one or more of tungsten, copper, titanium or titanium nitride as the conductive metal.

* * * * *